United States Patent
Yamamuro et al.

(10) Patent No.: US 7,718,468 B2
(45) Date of Patent: May 18, 2010

(54) MANUFACTURE METHOD FOR ZNO-CONTAINING COMPOUND SEMICONDUCTOR LAYER

(75) Inventors: Tomofumi Yamamuro, Kawasaki (JP); Michihiro Sano, Odawara (JP); Hiroyuki Kato, Yokohama (JP); Akio Ogawa, Yamato (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/194,791

(22) Filed: Aug. 20, 2008

(65) Prior Publication Data

US 2009/0061559 A1 Mar. 5, 2009

(30) Foreign Application Priority Data

Aug. 30, 2007 (JP) ............................. 2007-224577

(51) Int. Cl.
*H01L 21/00* (2006.01)
(52) U.S. Cl. ................... 438/104; 438/285; 438/483; 257/E21.006; 257/E21.109; 257/E21.168
(58) Field of Classification Search ............... 438/518, 438/572, 590, 602; 257/E21.097, E21.098, 257/E21.109, E21.118
See application file for complete search history.

(56) References Cited

U.S. PATENT DOCUMENTS

| 4,219,608 | A  | * | 8/1980 | Nishiyama et al. | ......... 428/432 |
| 2002/0014631 | A1 | * | 2/2002 | Iwata et al. | ................. 257/89 |
| 2007/0134842 | A1 |   | 6/2007 | Kotani et al. | |
| 2009/0064896 | A1 | * | 3/2009 | Pearce et al. | ................ 106/36 |

FOREIGN PATENT DOCUMENTS

| JP | 2004-221352 A | 8/2004 |
| JP | 2007-128936 A | 5/2007 |

OTHER PUBLICATIONS

Hiroyuki Kato, Michihiro Sano, Kazuhiro Miyamoto, Takafumi Yao. "High-Quality ZnO Epilayers Grown on Zn-Face ZnO Substrates by Plasma-Assisted Molecular Beam Epitaxy". Journal of Crystal Growth 265 (2004) 375-381. Elsevier: Feb. 10, 2004.

* cited by examiner

*Primary Examiner*—Savitri Mulpuri
*Assistant Examiner*—Cheung Lee
(74) *Attorney, Agent, or Firm*—Frishauf, Holtz, Goodman & Chick, P.C.

(57) ABSTRACT

A method includes (a) preparing a substrate, and (b) growing a ZnO-containing compound semiconductor layer above the substrate by supplying at the same time at least Zn and O as source gases and S as a surfactant.

10 Claims, 11 Drawing Sheets

15μm × 15μm

1μm × 1μm

MANUFACTURE METHOD FOR ZNO-CONTAINING COMPOUND SEMICONDUCTOR LAYER

CROSS REFERENCE TO RELATED APPLICATION

This application is based on and claims priority of Japanese Patent Application No. 2007-224577, filed on Aug. 30, 2007, the entire contents of which are incorporated herein by reference,

BACKGROUND OF THE INVENTION

A) Field of the Invention

The present invention relates to a manufacture method for a ZnO-containing compound semiconductor layer.

B) Description of the Related Art

Zinc oxide (ZnO) is direct transition type semiconductor having a band gap of about 3.3 eV at a room temperature and an exciton binding energy of 60 meV higher than that of other semiconductors, and is expected as the material of a high efficiency light emitting device. Mixed crystal such as $Mg_xZn_{1-x}O$ is also used to adjust a band gap. ZnO and mixed crystal having the same crystalline structure as that of ZnO are herein called ZnO-containing compound semiconductor.

In manufacturing, for example, a ZnO-containing compound semiconductor light emitting device, it is very important to control epitaxial growth of a thin film at an atomic level in order to improve the function of the light emitting device. One of recent leading research approaches to epitaxial growth of a thin film is surfactant mediated epitaxy. This approach artificially changes a growth mode of a thin film by using surface active agent (atoms or molecules) called surfactant, and is a useful means for epitaxial growth control.

JP-A-2004-221352 (which is incorporated herein by reference) discloses techniques of using hydrogen as surfactant when a ZnO-containing compound semiconductor layer is grown.

JP-A-2007-128936 (US-2007-0134842, which is incorporated therein by reference) discloses a temperature range of two-dimensional growth when an undoped ZnO layer is formed on a Zn polar surface of a ZnO substrate. FIGS. 1A to 1D in this Publication are reproduced in FIGS. 11A to 11D of this application. FIG. 11A shows a relation between a substrate temperature and a growth rate. FIGS. 11B to 11D show RHEED images of ZnO layers grown at substrate temperatures of 800° C., 850° C. and 1000° C., respectively (RHEED images of ZnO layers corresponding to plots 1B, 1C and 1D in FIG. 11A). At a substrate temperature not lower than 850° C., the RHEED images indicate streak patterns and it can be known that two-dimensional growth occur (FIGS. 11C and 11D). At a substrate temperature lower than 850° C., the RHEED image indicates spot patterns and three-dimensional growth occurs (FIG. 11A).

This Publication further discloses the following knowledge regarding a relation between a ratio between Zn and O and a growth mode. A flux intensity of Zn is represented by $J_{Zn}$, and a flux intensity of O radical is represented by $J_O$. A coefficient (Zn sticking coefficient) indicating a bonding feasibility of Zn to an O terminated plane of ZnO crystal is represented by $K_{Zn}$, and a coefficient (O sticking coefficient) indicating a bonding feasibility of O to a Zn terminated plane is represented by $K_O$.

A product $K_{Zn} \cdot J_{Zn}$ of the Zn bonding coefficient $K_{Zn}$ and the flux intensity $J_{Zn}$ corresponds to the number of Zn atoms bonded in a unit area of a substrate per unit time. A product $K_O \cdot J_O$ of the O bonding coefficient $K_O$ and the flux intensity $J_O$ corresponds to the number of O atoms bonded in a unit area of a substrate per unit time. A ratio of the product $K_O \cdot J_O$ to the product $K_{Zn} \cdot J_{Zn}$ is defined as a flux ratio. The flux ratio larger than 1 is called an O rich condition, whereas the flux ratio smaller than 1 is called a Zn rich condition.

H. Kato. M, Sano, K, Miyamoto, T. Yao: Journal of Crystal Growth 265 (2004); pp. 375-381 which is incorporated herein by reference, reports that RHEED images of ZnO layers had streak patterns, the ZnO layers being formed under an extremely O rich condition (flux ratio $\geqq 5.6$) and at various flux ratios, and suggests a ZnO layer is likely to grow three-dimensionally if the O rich condition is not extreme.

For example, a ZnO-containing compound semiconductor light emitting device has a multi-layer structure laminating an n-type semiconductor layers an emission layer a p-type semiconductor layer and the like. Improving flatness of an interface between lower layers is desired to form upper layers by good epitaxial growth. Techniques of improving flatness of a ZnO-containing compound semiconductor layer has been long desired.

SUMMARY OF THE INVENTION

An object of the present invention is to provide a manufacture method for a ZnO-containing compound semiconductor layer with improved flatness.

According to one aspect of the present invention, a method includes (a) preparing a substrate, and (b) growing a ZnO-containing compound semiconductor layer above the substrate by supplying at the same time at least Zn and O as source gases and S as a surfactant.

When the ZnO-containing compound semiconductor layer is formed, S is radiated as surfactant so that flatness of the ZnO-containing compound semiconductor layer can be improved.

DESCRIPTION OF THE PREFERRED EMBODIMENTS

Figure 1:
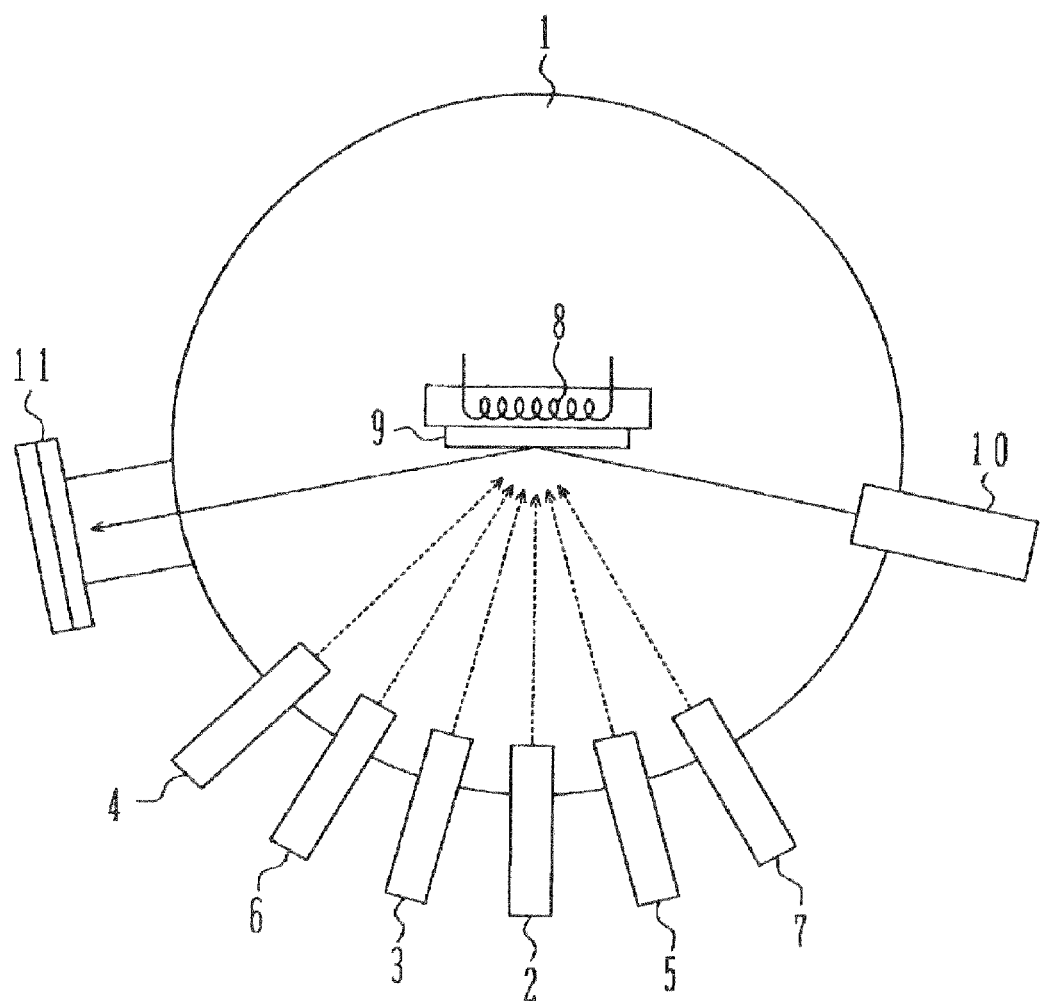
FIG. 1 is a schematic diagram showing an example of a film folding system for growing a ZnO-containing compound semiconductor layer.

With reference to FIG. 1, description will be made on an example of a film forming system for growing a ZnO-containing compound semiconductor crystal layer. Molecular beam epitaxy (MBE) is used as a film informing method. In an ultra high vacuum vessel 1 a stage 8 including a substrate heater is disposed, and a substrate 9 is held by the stage 8. The ultra high vacuum is vacuum at a pressure of $1 \times 10^{-7}$ Torr or lower.

The substrate 4 may be a sapphire ($Al_2O_3$) substrate, a silicon carbide SiC) substrate, a gallium nitride (GaN) substrate, a ZnO substrate, a ZnMgO substrate or the like. The smaller the lattice mismatch of the substrate is, a ZnO-containing compound semiconductor layer has better crystallinity. It is therefore most preferable to use a ZnO substrate.

The ultra high vacuum vessel 1 is equipped with a Zn source gun 2, an O source gun 3, a ZnS source gun 4, an Mg source gun 5, an N source gun 6 and a Ga source gun 7. The Zn source gun 2, ZnS source gun 4, Mg source gun 5 and Ga source gun 7 have Knudsen cells for accommodating Zn, ZnS, Mg and Ga solid sources, respectively, to radiate Zn, ZnS, Mg and Ga beams, respectively.

The O source gun 3 and N source gun 6 have electrodeless discharge tubes at a radio frequency (e.g., 13.56 Mhz). The O source gun 3 and N source gun 6 radiate O and N radical beams, respectively, by making oxygen and nitrogen gases be radical in the electrodeless discharge tubes. A ZnO-containing compound semiconductor layer having a desired composition can be formed on the substrate 9 by supplying the substrate 9 with desired beams at desired timings.

A sulfur source is not limited to ZnS, but it is possible to use, for example, S. The Mg source gun 5, N source gun 6 and Ga source gun 7 are provided when necessary, for example, when a light emitting diode (LED) or the like is manufactured.

A reflection high energy electron diffraction (RHEED) gun 10 and a screen 11 on which an RHEED image is projected are also mounted on the ultra high vacuum vessel 1. Flatness of the surface a crystal layer formed on the substrate 9 can be evaluated from a RHEED image. If crystal grows two-dimensionally and its surface is flat, the RHEED image shows streak patterns, whereas if crystal grows three-dimensionally and its surface is not flat, the RHEED image shows spot patterns.

Next, description will be made on a growth method for a ZnO layer according to a comparative example. A c plane ZnO substrate is used as a substrate, and a ZnO layer is grown on the Zn polar surface (+c plane). First, the ZnO substrate was subjected to thermal annealing to clean the substrate surface. The thermal annealing was performed for 30 minutes at 900° C. under a high vacuum of $1 \times 10^{-9}$ Torr.

Next, at a substrate temperature of 350° C., a Zn beam and an O radical beam were radiated to the ZnO substrate to form a ZnO buffer layer. The Zn beam was radiated at a beam flux quantity of $9.86 \times 10^{13}$ atoms/($cm^2$sec) (hereinafter, a representation like E+13 atoms/($cm^2$sec) for $\times 10^{13}$ atoms/($cm^2$sec) is adopted), by using Zn at a purity of 7N as a solid source. The O radical beam was radiated by introducing pure oxygen gas at a purity of 6N at a flow rate of 3 seem and making O plasma at a radio frequency (RF) power of 300 W. In succession, in order to improve crystallinity of the buffer layer, thermal annealing was preformed for 20 minutes at a substrate temperature raised to 800° C.

Next, the substrate temperature was lowered to 700° C., and a Zn beam and an O radical beam were radiated to the buffer layer to form a ZnO layer. The Zn beam was radiated at a beam flux quantity of 6.58E+14 atoms/($cm^2$sec) by using Zn at a purity of 7N as a solid source. The O radical beam was radiated by introducing pure oxygen gas at a purity of 6N at a flow rate of 2 seem and making O plasma at an RF power of 300 W.

Figure 9A:
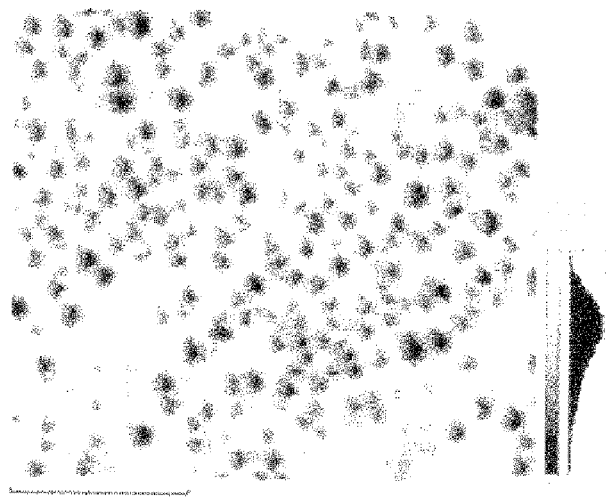
FIGS. 9A and 9B show AFM images of a ZnO layer of the comparative example.
Figure 9B:
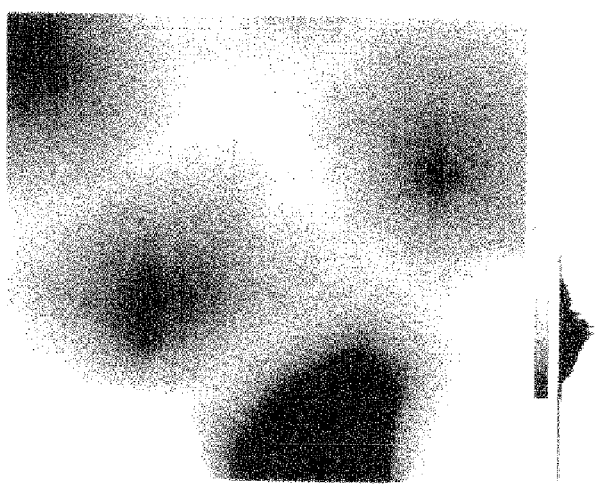
Figure 10:
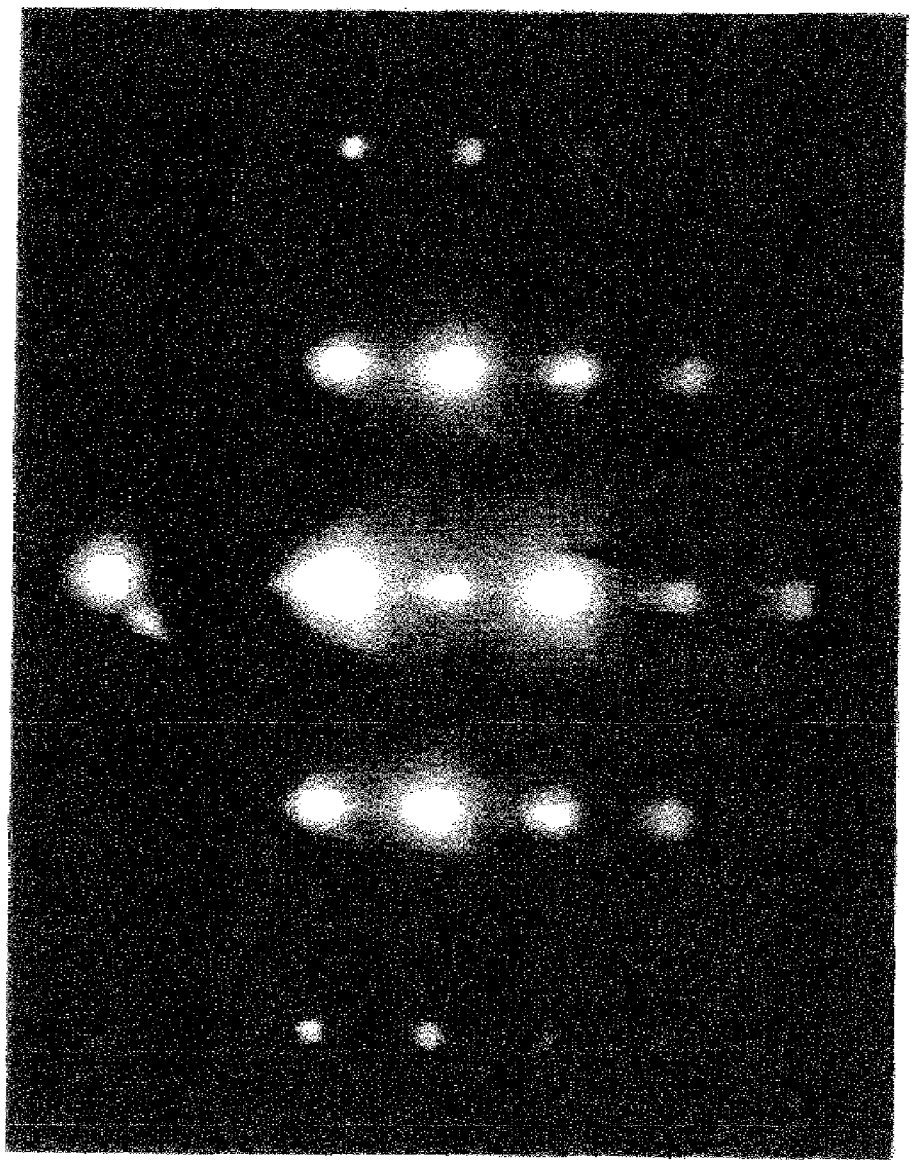
FIG. 10 shows a RHEED image of the ZnO layer of the comparative example.
Figure 11A:
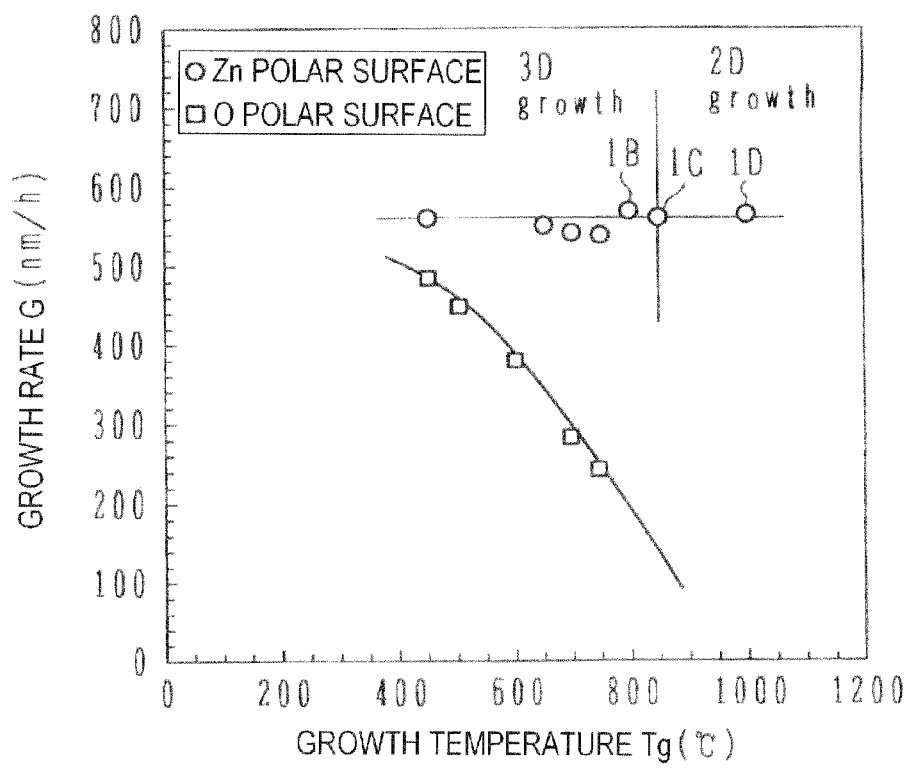
FIG. 11A is a graph showing the relation between a growth temperature and a growth rate of a ZnO layer grown on a Zn polar surface and a ZnO layer grown on an O polar surface.
Figure 11B:
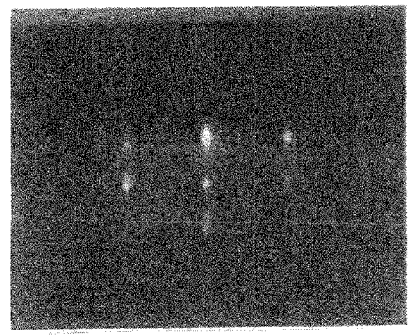
FIGS. 11B to 11D show RHEED images of ZnO layers formed under the conditions of plots 1B to 1D in FIG. 11A, respectively.
Figure 11C:
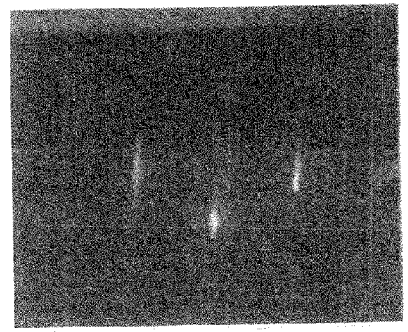
Figure 11D:
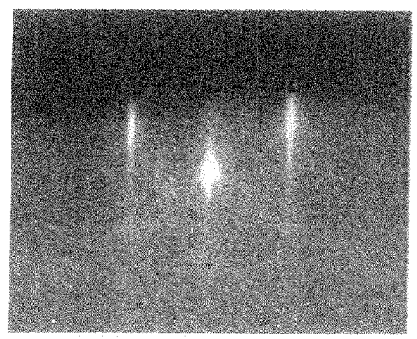

FIGS. 9A and 9B show atomic force microscopic (AFM) images of the ZnO layer manufactured by the comparative example method, and FIG. 10 shows a RHEED image of the ZnO layer. FIGS. 9A and 9B show the AFM images in an area of 15 μm×15 μm and in an area of 1 μm×1 μm. FIG. 10 shows the RHEED image upon incidence of an electron beam along a [11-20] direction.

The AFM images show dispersed hexagonal dents and it can be known that flatness is bad. An RMS value representative of surface roughness is very large: 71.58 nm in the area of 15 μm×13 μm and 30.98 nm in the area of 1 μm×1 μm. The RHEED image shows spot patterns, and it can be known also from the RHEED image that flatness is bad. The RMS value is a root mean square of deviations from an average value.

Next, description will be made on a growth method for a ZnO-containing compound semiconductor layer according to first to fourth embodiments which form the ZnO layer while S is supplied. In the first to fourth embodiments, similar to the comparative example, a c plane ZnO substrate is used as a substrate, and a ZnO-containing compound semiconductor layer is grown on the Zn polar surface.

Also under the conditions similar to the comparative example, the ZnO substrate is subjected to thermal annealing to clean the substrate surface, thereafter, a Zn beam and an O radical beam are radiated to the ZnO substrate to form a ZnO buffer layer and then annealing is preformed to improve crystallinity of the buffer layer.

Description will be made first on the growth method for a ZnO layer according to the first embodiment. After annealing the buffer layer, the substrate temperature was lowered to 700° C., and a Zn beam, an O radical beam and a ZnS beam were supplied at the same time to the buffer layer to form a ZnO layer.

The Zn beam was radiated at a beam flux quantity of 6.58E+14 atoms/($cm^2$sec) by using Zn at a purity of 7N as a solid source. The O radical beam was radiated by introducing pure oxygen gas at a purity of 6N at a flow rate of 2 sccm and making O plasma at an R-F power of 300 W.

The ZnS beam was radiated at a beam flux quantity of 2.51E+14 atoms/($cm^2$sec) by using ZnS at a purity of 5N as a solid source. The ZnS beam flux quantity is a measurement result with a film thickness monitor using a quartz oscillator at a growth position and at a room temperature. In the first embodiment, a ZnS/Zn ratio of a ZnS flux to a Zn flux is 0.38.

Figure 2:
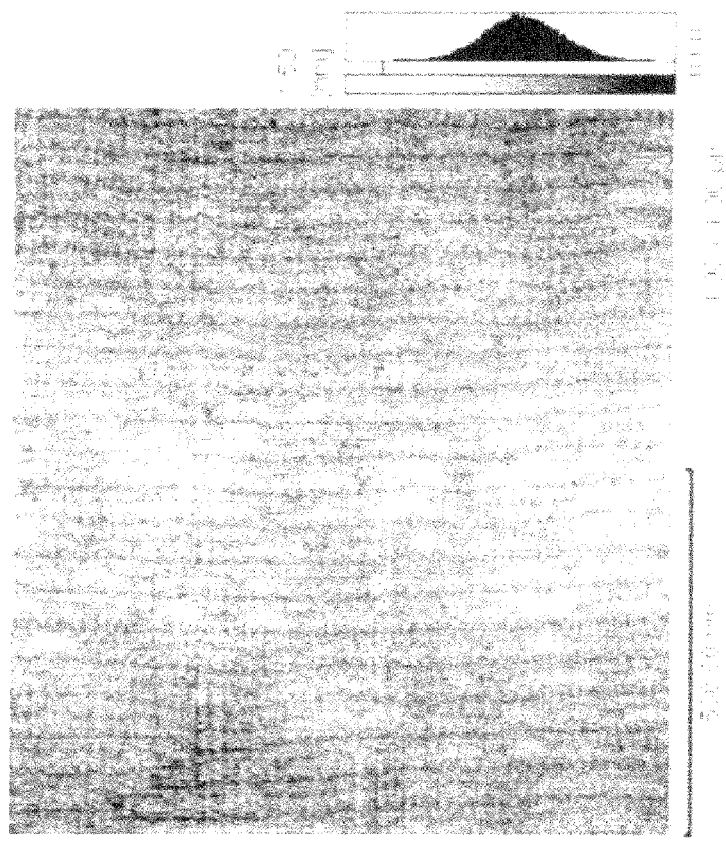
FIG. 2 is an AFM image of a ZnO layer according to a first embodiment.
Figure 3:
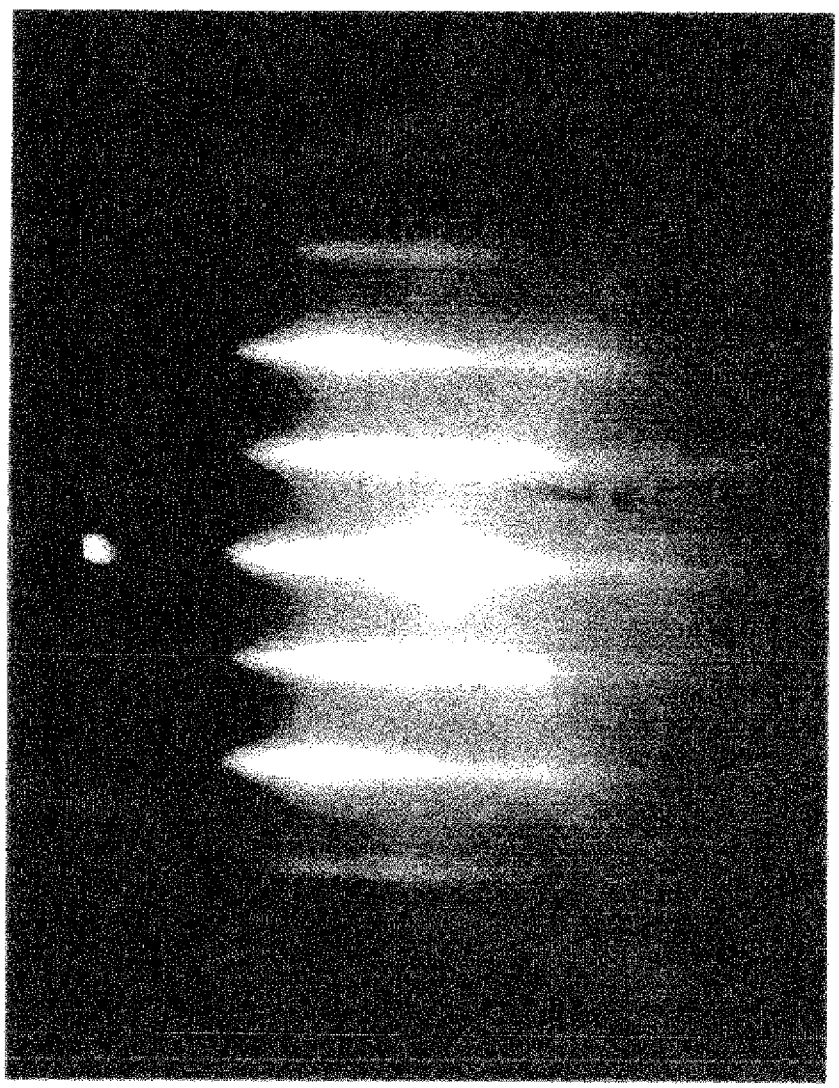
FIG. 3 is a RHEED image of the ZnO layer of the first embodiment.

FIGS. 2 and 3 show an AFM image and a RHEED image of the ZnO layer formed by the first embodiment method. FIG. 2 shows the AFM image in the area of 1 μm×1 μm, and FIG. 3 shows the RHEED image upon incidence of an electron beam along a [11-20] direction.

It is remarkable that a step-and-terrace structure appears in the AFM image, and flatness is very good. An RMS value representative of surface roughness is very small: 0.196 nm of AFM measurement in the area of 1 μm×1 μm (an RMS value is 2.853 nm of AFM measurement in the area of 15 μm×15 μm). Streak patterns appear in the RHEED image, and it can be known that crystal is grown two-dimensionally.

Next, description will be made on the growth method of a ZnO layer according to second to fourth embodiments. In the second to fourth embodiments of the growth method, a ZnS beam flux quantity is made different from that of the first embodiment, when a ZnO layer is formed.

In the second embodiment, a ZnS beam flux quantity was set to 6.58E+13 atoms/(cm see). A ZnS/Zn ratio of a ZnS flux to a Zn flux is 0.10. RMS values representative of surface roughness by AFM measurement were 23.31 nm and 29.03 nm in the area of 1 μm×1 μm and in the area of 15 μm×15 μm, respectively, and spot patterns appeared in the RHEED image, indicating three-dimensional growth.

In the third embodiment, a ZnS beam flux quantity was set to 1.34E+14 atoms/(cm$^2$sec). A ZnS/Zn ratio of a ZnS flux to a Zn flux is 0.20. RMS values representative of surface roughness by AFM measurement were 0.203 nm and 5.813 nm in the area of 1 μm×1 μm and in the area, of 15 μm×15 μm, respectively, and streak patterns appeared in the RHEED image, indicating two-dimensional growth.

In the fourth embodiment, a ZnS beam flux quantity was set to 4.28E+14 atoms/(cm$^2$sec). A ZnS/Zn ratio of a ZnS flux to a Zn flux is 0.65. RMS values representative of surface roughness by AFM measurement were 0.282 nm and 0.373 nm in the area of 1 μm×1 μm and in the area of 15 μm×15 μm, respectively, and streak patterns appeared in the RHEED image, indicating two-dimensional growth.

Figure 4:
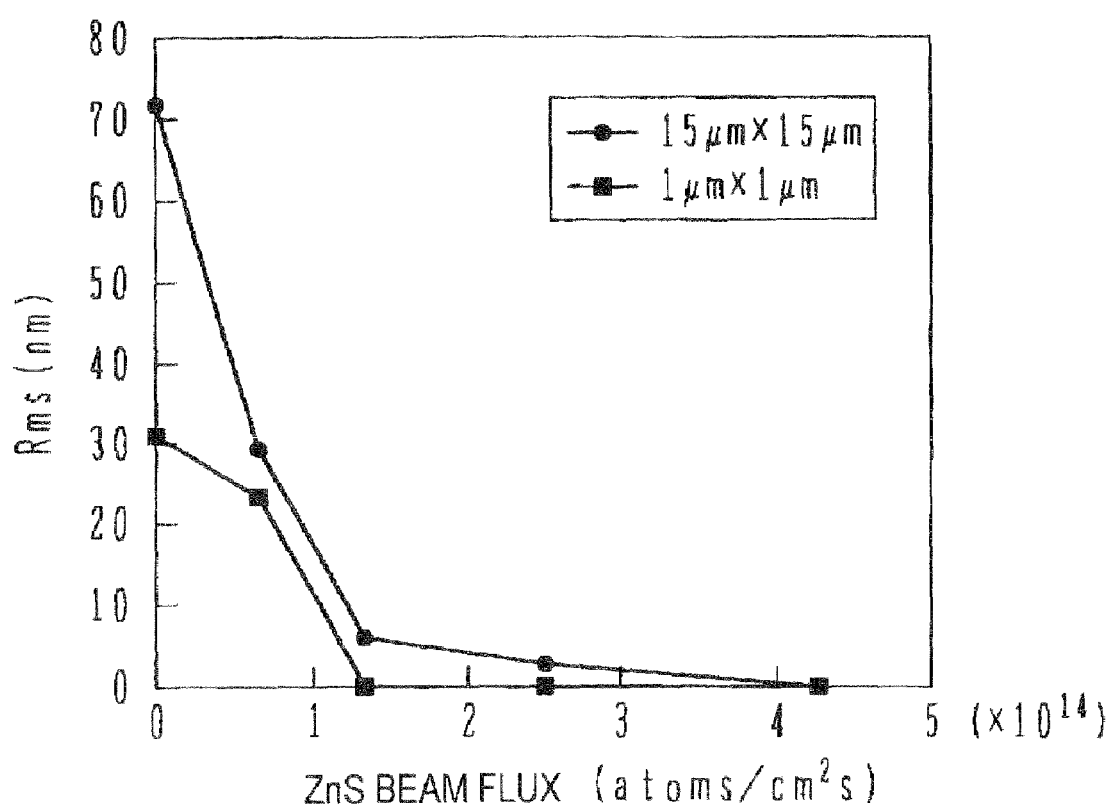
FIG. 4 is a graph showing a dependency of an RMS value upon a ZnS beam flux quantity, according to first to fourth embodiments and a comparative example.

FIG. 4 is a graph showing a dependency of an RMS value upon a ZnS beam flux quantity indicating measurement results of the first to fourth embodiments and the comparative example. The RMS value lowers as S is radiated as in the first to fourth embodiments, more than the comparative example without S radiation. It can therefore be known that flatness of the ZnO layer is improved. Although the RMS value of the comparative example is over 70 nm the area of 15 μm×15 μm, the RMS value is smaller than 30 nm or a half of 70 nm, at the ZnS flux beam quantity of 6.58E+13 atoms/(cm$^2$sec) (a ZnS/Zn flux ratio of 0.1 (second embodiment)).

The ZnO crystal growth mode can be made two-dimensional at a ZnS beam flux quantity not smaller than 134E+14 atoms/(cm$^2$sec) (a ZnS/Zn flux ratio not smaller than 0.20 (first, third and fourth embodiments)). The RMS value in the area of 15 μm×15 μm is about 5.8 nm or not larger than 1/10 of that of the comparative example, at a ZnS beam flux quantity of 1.34E+14 atoms/(cm$^2$sec) (a ZnS/zn flux ratio not smaller than 0.2 (third embodiment)).

In the first to fourth embodiments, the product $K_O J_O$ of the O sticking coefficient $K_O$ and flux intensity $K_O$ is 8.75E+14 atoms/(cm$^2$sec), and growth is performed under a Zn rich condition at a flux ratio $K_O J_O / K_{Zn} J_{Zn}$ of O to Zn=0.75.

As described above, it has been found that flatness is improved by growing ZnO crystal while S is supplied, more than not supplying S, even at a growth temperature lower than 850° C. which is a lower limit of two-dimensional growth by a conventional method and even under the Zn rich condition The substrate temperature of 700° C. of the first to fourth embodiments is a temperature lower than 750° C. which is lower than a conventional 850° C. by more than 100° C. It has been found therefore that S functions as surfactant for improving flatness during ZnO crystal growth. It has also been found that ZnO crystal can be two-dimensionally grown by supplying S at a sufficiently high flux quantity.

Next, description will be made on absorption measurement and element analysis through electron probe micro-analysis (EPMA) of the ZnO layer formed by the fourth embodiment method.

Figure 5:
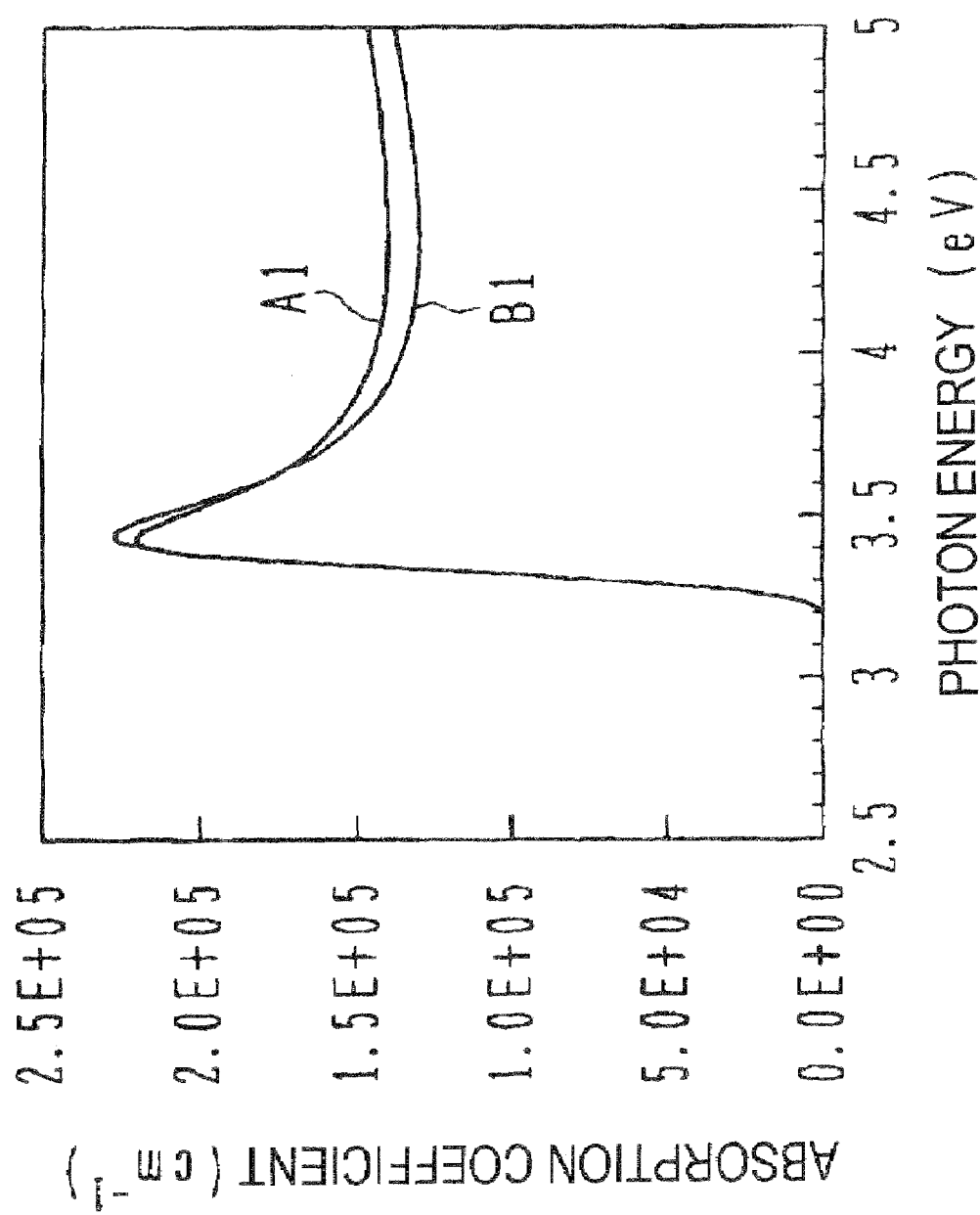
FIG. 5 is a graph showing a dependency of a photon energy upon an absorption coefficient, of ZnO layers of the fourth embodiment and the comparative example.

FIG. 5 is a graph showing a dependency of an absorption coefficient upon a photon energy. The abscissa represents a photon energy in the unit of eV, and the ordinate represents an absorption coefficient. A curve A1 indicates a result of the fourth embodiment, and a curve B1 indicates a result of the comparative example (without ZnS radiation).

In the fourth embodiment and comparative example, from rise portions to peak portions of absorption coefficients are generally superposed. Namely, it can be known that absorption ends of the fourth embodiment and comparative example are almost coincident and band gaps are approximately equal.

The ZnO layer of the fourth embodiment was grown while the ZnS beam was radiated at the beam flux quantity of 4.28E+14 atoms/(cm$^2$see). The band gap is approximately equal to the band gap of 3.3 eV of the comparative example ZnO layer. Namely, it can be known that the ZnO growth method of the fourth embodiment changes only the crystal growth mode while maintaining the band gap of ZnO. That the band gaps are approximately equal is intended to mean a difference from the ZnO band gap (3.3 ev) is not larger than 0.2 eV.

Figure 6:
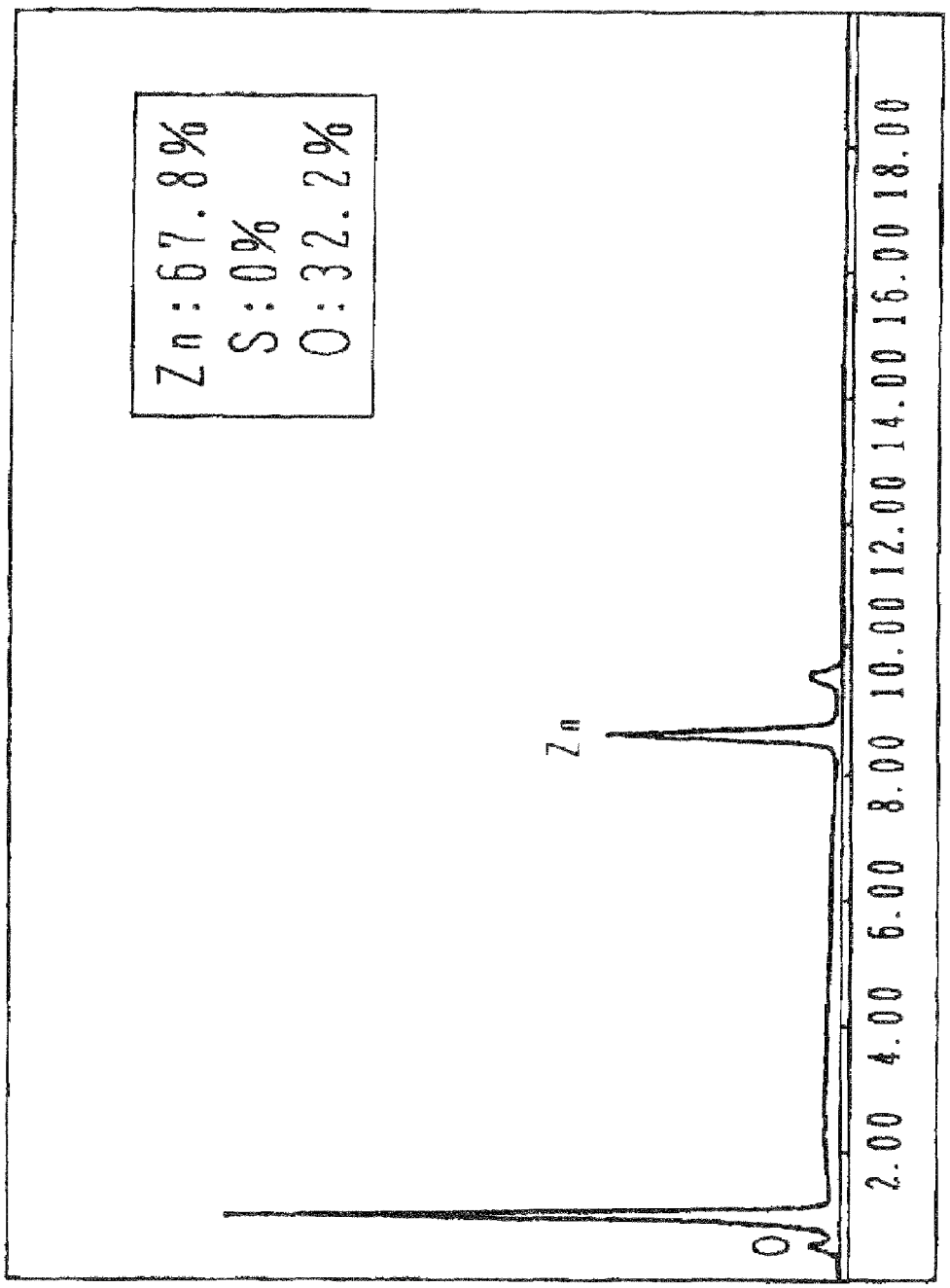
FIG. 6 is a graph showing an element analysis result of the Zn layer of the fourth embodiment, by EPMA measurement.
Figure 7:
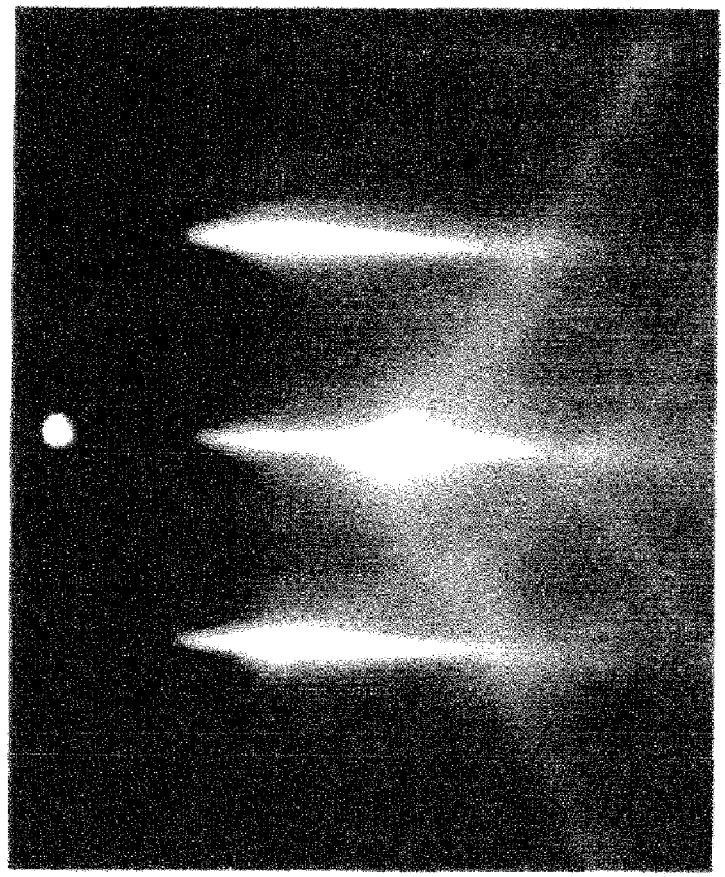
FIG. 7 is a RHEED image of a $Zn_{1-x}Mg_xO$ layer according to a fifth embodiment.

FIG. 6 is a graph showing an element analysis result by EPMA measurement. S in the order of 0.1 atom % as a detection lower limit of EPMA measurement was not detected from the ZnO layer of the fourth embodiment. Although the growth methods of the embodiments grow a ZnO layer while ZnS is radiated, S is scarcely contained in the formed ZnO crystal, and good crystal of undoped ZnO can be grown.

As described above, the ZnO layer growth method using S as surfactant can improve flatness of the ZnO layer with almost no composition change by S. The growth method using S as surfactant is expected to be effective for improving flatness also for an n-type ZnO layer doped with Ga, a p-type ZnO layer doped with N and the like, because their mother crystal is ZnO.

Next, description will be made on a growth method for a $Zn_{1-x}Mg_xO$ layer (0<x≦1) according to the fifth embodiment. Similar to the first to fourth embodiments and comparative example, a c plane ZnO substrate is subjected to thermal annealing to clean the substrate surface, then a Zn beam and an O radical beam are radiated to the +c plane of the ZnO substrate to form a ZnO buffer layer, and annealing is performed to improve crystallinity of the buffer layer.

In the fifth embodiment, after the buffer layer was annealed, the substrate temperature was lowered to 700° C., and a Zn beam, an O radical beam, a ZnS beam and an Mg beam were radiated to the buffer layer to form $Zn_{1-x}Mg_xO$ layer, The Zn beam was radiated at a beam flux quantity of 7.89E+14 atoms/(cm$^2$sec) by using Zn at a purity of 7N as a solid source. The O radical beam was radiated by introducing pure oxygen gas at a purity of 6N at a flow rate of 3 sccm and making O plasma at an RF power of 300 W.

The ZnS beam was radiated at a beam flux quantity of 2.51E+14 atoms/(cm$^2$sec) by using ZnS at a purity of 5N as a solid source. The Mg beam flux was radiated at a beam flux quantity of 6.18E+13 atoms/(cm$^2$sec) by using Mg at a purity of 7N as a solid source. A ZnS/Zn flux ratio is 0.32.

FIG. 5 shows a RHEED image of the $Zn_{1-x}Mg_xO$ layer formed by the fifth embodiment upon incidence of an electron beam along a [11-20] direction. The RHEED image shows streak patterns, and it can be known that two-dimensional growth occurs. An Mg concentration of the $Zn_{1-x}Mg_xO$ layer of the filth embodiment was x=0.28 by EPMA measurement. Even if Mg or the like is introduced, by supplying S at the same time, flatness of the ZnO-containing compound semiconductor layer can be improved. S is not detected also from the $Zn_{1-x}Mg_xO$ layer formed by the fifth embodiment.

As an Mg concentration x of $Zn_{1-x}Mg_xO$ exceeds 0.5, there is a fear that MgO of a rock-salt structure and ZnMgO of a wurtzite structure may undergo phase separation so that this layer is preferably formed in a range of $x \leq 0.5$.

As described above, the techniques of improving flatness of a ZnO-containing compound semiconductor layer by supplying S as surfactant at the same time when the layer is grown are effective for manufacturing a semiconductor device having a lamination structure of multi semiconductor layers such as an LED.

Figure 8:
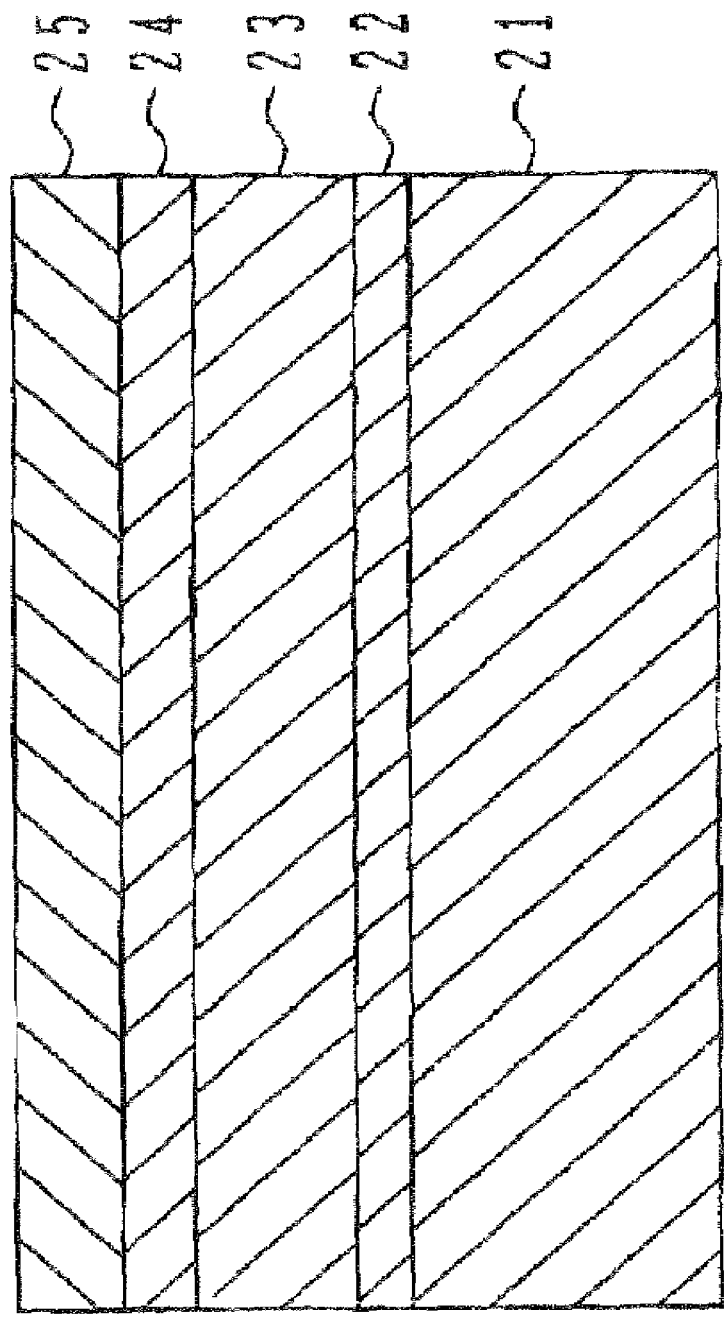
FIG. 8 is a schematic cross sectional view showing an example of the structure of a semiconductor wafer to be used for a ZnO-containing compound semiconductor light emitting device.

FIG. 8 is a schematic cross sectional view of a semiconductor wafer structure to be used for LED's. A buffer layer 22 is formed on a substrate 21, an n-type semiconductor layer 23 is formed on the buffer layer 22, an emission layer is 24 is formed on the n-type semiconductor layer 23, and a p-type semiconductor layer 25 is formed on the emission layer 24. The emission layer 24 may be of a multi quantum well (MGW) structure or a double hetero structure. The n-type semiconductor layer 23 and p-type semiconductor layer 25 may each have a multi-layer structure including a barrier layer. If flatness of an interface between lower layers is improved by using S as surfactant, epitaxial growth of upper layers is expected to become good.

In the embodiments, although MBE has been used as a film forming method, even if other film forming methods are used, S will effectively function as surfactant for improving flatness. Other film forming methods may be metal organic chemical vapor deposition (MOCVD), pulse laser deposition (PLD) and the like. Atomic layer epitaxy (ALE) may also be used. If ALE is used, S is supplied together with a Zn beam, or after an O beam is radiated and before a Zn beam is radiated, S is supplied.

The ZnO-containing compound semiconductor layer with improved flatness using S as surfactant is applicable to various products. For example, this layer is applicable to short wavelength (ultraviolet to blue) LED's, laser diodes (LD's) and their application products (e.g., various indicators, and displays). The layer is also applicable to white LED's and its application products (e.g., illumination instruments, various indicators, displays, and backlight of various display devices). The layer is further applicable to, for example, ZnO-containing electrodes (e.g., transparent conductive films), ZnO-containing transistors, ZnO-containing sensors (e.g., humidity sensors) and their application products.

The present invention has been described in connection with the preferred embodiments. The invention is not limited only to the above embodiments. It will be apparent to those skilled in the art that other various modifications, improvements, combinations, and the like can be made.

What are claimed are:

1. A method comprising:
   (a) preparing a substrate; and
   (b) growing a ZnO-containing compound semiconductor layer above said substrate by supplying at the same time at least Zn and O as source gases and S as a surfactant, wherein said step (b) is performed by molecular beam epitaxy, ZnS is used as an S source, a ratio of a ZnS flux to a Zn flux is 0.65 or lower, and the ZnO-containing compound semiconductor layer is an epitaxial layer.

2. The method according to claim 1, wherein the ZnO-containing compound semiconductor layer grown in said step (b) contains less than 0.1 atom % S.

3. The method according to claim 1, wherein said step (b) grows a ZnO crystal layer, and a band gap of the grown ZnO crystal layer is approximately equal to a band gap of ZnO.

4. The method according to claim 3, wherein the ratio of the ZnS flux to the Zn flux is 0.10 or higher.

5. The method according to claim 4, wherein the ratio of the ZnS flux to the Zn flux is 0.20 or higher.

6. The method according to claim 1, wherein said step (b) grows the ZnO-containing compound semiconductor layer at a substrate temperature lower than 850° C.

7. The method according to claim 6, wherein in said step (b) the substrate temperature is lower than 750° C.

8. The method according to claim 1, wherein said step (b) grows the ZnO-containing compound semiconductor layer under a Zn rich condition.

9. The method according to claim 1, wherein in said step (b), Mg is also supplied together with Zn, O and S to form a $Zn_{1-x}Mg_xO$ layer (0<x<1).

10. The method semiconductor layer according to claim 9, wherein an Mg composition of the $Zn_{1-x}Mg_xO$ layer is not larger than 0.5.

* * * * *